(12) United States Patent
Takaya et al.

(10) Patent No.: US 8,697,241 B2
(45) Date of Patent: Apr. 15, 2014

(54) GLASS FILM LAMINATE

(75) Inventors: Tatsuya Takaya, Otsu (JP); Masahiro Tomamoto, Otsu (JP); Hiroshi Takimoto, Otsu (JP); Hirokazu Okamoto, Otsu (JP)

(73) Assignee: Nippon Electric Glass Co., Ltd., Shiga (JP)

( * ) Notice: Subject to any disclaimer, the term of this patent is extended or adjusted under 35 U.S.C. 154(b) by 126 days.

(21) Appl. No.: 12/826,965

(22) Filed: Jun. 30, 2010

(65) Prior Publication Data

US 2011/0045239 A1 Feb. 24, 2011

(30) Foreign Application Priority Data

Jul. 3, 2009 (JP) .................................. 2009-158850
Feb. 12, 2010 (JP) .................................. 2010-028743

(51) Int. Cl.
| | | |
|---|---|---|
| *B32B 3/02* | (2006.01) | |
| *B32B 3/24* | (2006.01) | |
| *B32B 3/30* | (2006.01) | |
| *B32B 7/02* | (2006.01) | |
| *B32B 7/06* | (2006.01) | |
| *B32B 17/00* | (2006.01) | |
| *B32B 17/06* | (2006.01) | |
| *C03B 17/00* | (2006.01) | |
| *C03B 17/06* | (2006.01) | |
| *B32B 37/04* | (2006.01) | |
| *B32B 37/16* | (2006.01) | |
| *B32B 37/18* | (2006.01) | |
| *B32B 38/12* | (2006.01) | |
| *B32B 38/18* | (2006.01) | |
| *B32B 38/10* | (2006.01) | |

(52) U.S. Cl.
USPC ............... 428/426; 428/77; 428/78; 428/120; 428/138; 428/172; 428/189; 428/192; 428/212; 428/332; 428/337; 428/409; 428/410; 65/90; 65/95; 65/98

(58) Field of Classification Search
None
See application file for complete search history.

(56) References Cited

U.S. PATENT DOCUMENTS

| 4,481,246 A * | 11/1984 | Melisz et al. ................. 428/210 |
| 4,595,561 A * | 6/1986 | Thornton et al. ............. 422/401 |
| 8,507,068 B2 * | 8/2013 | Takaya et al. .................. 428/76 |
| 2003/0016447 A1 | 1/2003 | Kato et al. |
| 2004/0197575 A1 * | 10/2004 | Bocko et al. .................. 428/432 |
| 2005/0173058 A1 * | 8/2005 | Chien et al. ................... 156/281 |

(Continued)

FOREIGN PATENT DOCUMENTS

| EP | 2 025 650 | 2/2009 |
| EP | 2 450 324 | 5/2012 |

(Continued)

OTHER PUBLICATIONS

Machine Translation of JP 09221342 A, Aug. 1997.*

(Continued)

*Primary Examiner* — Aaron Austin
*Assistant Examiner* — Jeff Vonch
(74) *Attorney, Agent, or Firm* — Wenderoth, Lind & Ponack, L.L.P.

(57) ABSTRACT

A glass film laminate includes a glass film and a supporting glass. The glass film and the supporting glass have surfaces in contact with each other, and each of the surfaces has a surface roughness Ra of 2.0 nm or less.

17 Claims, 5 Drawing Sheets

(56) References Cited

U.S. PATENT DOCUMENTS

| | | | |
|---|---|---|---|
| 2009/0110882 A1* | 4/2009 | Higuchi | 428/138 |
| 2009/0226671 A1* | 9/2009 | Yanase et al. | 428/156 |
| 2011/0045229 A1 | 2/2011 | Takaya et al. | |
| 2011/0123787 A1 | 5/2011 | Tomamoto et al. | |
| 2012/0080403 A1 | 4/2012 | Tomamoto et al. | |

FOREIGN PATENT DOCUMENTS

| | | | | |
|---|---|---|---|---|
| EP | 2 463 253 | | 6/2012 | |
| EP | 2 479 151 | | 7/2012 | |
| JP | 08-86993 | | 4/1996 | |
| JP | 09-221342 | | 8/1997 | |
| JP | 09221342 A | * | 8/1997 | C03C 27/06 |
| JP | 2000-56113 | | 2/2000 | |
| JP | 2005-338281 | | 12/2005 | |
| JP | 2006-178168 | | 7/2006 | |
| JP | 2006178168 A | * | 7/2006 | |
| JP | 2007-326358 | | 12/2007 | |
| JP | 2008-133174 | | 6/2008 | |
| JP | 2008-216521 | | 9/2008 | |
| JP | 2009088158 A | * | 4/2009 | |
| WO | 2007/129554 | | 11/2007 | |
| WO | WO 2007129554 A1 | * | 11/2007 | |

OTHER PUBLICATIONS

Machine Translation of JP 2006178168 A, Jul. 2006.*
English Abstract of JP 2009088158 A, Apr. 2009.*
Taylor, Howard L., The Taylor Permanent Microscope Slide, May 2000.*
SPI Supplies, Mar. 2006.*
International Preliminary Report on Patentability and Written Opinion of the International Searching Authority issued Feb. 23, 2012 in International (PCT) Application No. PCT/JP2010/060995.
International Search Report issued Aug. 17, 2010 in corresponding International (PCT) Application No. PCT/JP2010/060995.
Supplementary European Search Report issued Oct. 14, 2013 in corresponding European Patent Application No. 10794115.5.

* cited by examiner

GLASS FILM LAMINATE

TECHNICAL FIELD

The present invention relates to a glass film laminate in which a glass film is supported with a supporting glass, the glass film being used for a flat panel display such as a liquid crystal display and an OLED display, a glass substrate for devices such as a solar cell, a lithium ion battery, a digital signage, a touch panel, and an electronic paper, a cover glass for devices such as an organic LED (OLED) lighting device, a package for a medicinal product, and the like.

BACKGROUND ART

In recent years, From the viewpoint of space saving, in place of a CRT type display conventionally and widely used, there have been widely used, flat panel displays such as a liquid crystal display, a plasma display, an OLED display, and a field emission display. Further reduction in thickness is demanded for these flat panel displays. In particular, it is required that the OLED display be easily carried by being folded or wound and be usable not only on a flat surface but also on a curved surface. Further, it is not just displays that are required to be usable not only on a flat surface but also on a curved surface. For example, if a solar cell or an OLED lighting device can be formed on a surface of an object having a curved surface, such as a surface of an automobile body, or a roof, a pillar, or an outer wall of a building, the applications of the solar cell or OLED lighting device may expand. Substrates and cover glasses used for these devices are required to be a thinner sheet and to have high flexibility.

A light-emitting element used for an OLED display deteriorates in quality through the contact of gasses such as oxygen and water vapor. Thus, a substrate used for the OLED display is required to have high gas-barrier property, and hence the use of a glass substrate for the substrate is expected. However, glass used for a substrate is weak in tensile stress unlike a resin film, and hence is low in flexibility. Thus, concentrarion of a tensile stress on a surface of a glass substrate by bending the glass substrate leads to the breakage of the glass substrate. In order to impart flexibility to the glass substrate, the glass substrate is required to achieve an ultra thin sheet. Thus, a glass film having a thickness of 200 μm or less is proposed as described in Patent Document 1 below.

A glass substrate used for electronic devices such as a flat panel display and a solar cell is subjected to various treatments associated with electronic device production, such as a treatment for providing a film such as a transparent conductive film and a cleaning treatment. However, when a glass film is used as a glass substrate for these electronic devices, the glass film breaks due to a stress change even at a small amount, because glass is a brittle material. Thus, there is a problem in that the handling of the glass film is very difficult, when the above-mentioned various treatments associated with electronic device production are carried out. In addition, there is another problem in that a glass film having a thickness of 200 μm or less is rich in flexibility, and hence the positioning of the glass film is difficult when the treatments associated with production are carried out, so that displacement or the like in patterning may occur.

Therefore, in order to enhance a handling easiness of a glass film, proposed is a laminate in which a glass film is laminated on a resin film after a pressure-sensitive adhesive substance is coated on the resin film. In such the glass film laminate, the glass film is supported by the resin film being a tough material, and hence the handling of the glass film laminate becomes easier compared to a case of the glass film alone when the above-mentioned various treatments associated with production are carried out.

However, there is a problem in that when the resin film is finally peeled off from the laminate to provide a glass film solely, the glass film which is a brittle material is easy to break, and the pressure-sensitive adhesive substance remains on the glass film after the resin film is peeled off, causing contamination. Further, there is a difference in thermal expansion coefficients of the resin film and the glass film, and hence, even in a case where a heat treatment is carried out at a relatively low temperature of around 200° C. as a treatment associated with production, there is a possibility in that thermal warpage, resin peeling, or the like may occur. In addition, there is another problem in that displacement or the like easily occurs when the positioning and the patterning during treatments associated with production are carried out, because the resin film is also rich in flexibility.

In order to solve the above-mentioned problems, a laminate is proposed as described in Patent Document 2 below. Patent Document 2 below proposes a laminate in which a supporting glass and a glass sheet are laminated via a pressure-sensitive adhesive layer that may be maintained almost stably even after its repeated use. According to such the laminate, even if a glass sheet having less strength and rigidity by itself is used, the production of a liquid crystal display device may be carried out with sharing a conventional line for producing a liquid crystal display device. Thus, after completion of the production processes, peeling off the glass sheet can be carried out quickly without the breakage of the glass substrate. Further, the thermal warpage or the like can be prevented from occurring to some extent, because the supporting member is made of glass. In addition, displacement or the like hardly occurs when the positioning and patterning during treatments associated with production are carried out, because the support member has high rigidity.

However, even in the above-mentioned laminate, there has not yet been solved such a problem that a pressure-sensitive adhesive remains on the thin glass sheet after peeling off of the supporting glass.

PRIOR ART DOCUMENTS

Patent Document

Patent Document 1: JP 2008-133174 A
Patent Document 2: JP 1996-86993 A

SUMMARY OF INVENTION

Technical Problem

The present invention has been made to solve the above-mentioned problems with prior arts. That is, an object of the present invention is to provide a glass film laminate, which has an enhanced handling easiness of a glass film when the glass film is subjected to treatments associated with production, does not cause a problem such as displacement at the time of positioning and patterning, enables easy peeling off the glass film from a supporting glass when the glass film is incorporated into each of various devices after the treatments associated with production, and which reliably prevents an occurrence of a residual of a pressure-sensitive adhesive on the glass film after peeling off the glass film.

Solution to Problem

The invention according to a first aspect relates to a glass film laminate, comprising a glass film and a supporting glass, wherein a surface of the glass film and a surface of the supporting glass, which are brought into contact with each other, have a surface roughness Ra of 2.0 nm or less respectively.

The invention according to a second aspect relates to a glass film laminate according to the first aspect, wherein the surface of the glass film and the surface of the supporting glass have a GI value of 1000 pcs/m² or less respectively.

The invention according to a third aspect relates to a glass film laminate according to the first or second aspect, wherein the glass film has a thickness of 300 μm or less.

The invention according to a fourth aspect relates to a glass film laminate according to the first to third aspects, wherein the supporting glass has a thickness of 400 μm or more.

The invention according to a fifth aspect relates to a glass film laminate according to the first to fourth aspects, wherein a difference of thermal expansion coefficients between the glass film and the supporting glass at 30 to 380° C. falls within $5 \times 10^{-7}$/° C.

The invention according to a sixth aspect relates to a glass film laminate according to the first to fifth aspects, wherein the glass film and the supporting glass are formed by an overflow down-draw method.

The invention according to a seventh aspect relates to a glass film laminate according to the first to sixth aspects, wherein the glass film and the supporting glass are laminated so that at least a part of an edge portion includes a step.

The invention according to an eighth aspect relates to a glass film laminate according to the first to seventh aspects, wherein a peeling sheet member is interposed at a partial region of a contact portion between the glass film and the supporting glass, and the peeling sheet member partially protrudes from the contact portion.

The invention according to a ninth aspect relates to a glass film laminate according to the first to eighth aspects, wherein the supporting glass includes at least one through-hole formed at a position being outside of an effective surface of the glass film.

The invention according to a tenth aspect relates to a glass film laminate according to the first to ninth aspects, wherein the glass film laminate includes a guide member for positioning the glass film on the supporting glass at the glass film side.

The invention according to an eleventh aspect relates to a glass film laminate according to the tenth aspect, wherein the guide member has a smaller thickness than the glass film.

Effects of Invention

According to the invention of the first aspect, since the glass film laminate is constituted by the supporting glass and the glass film, the glass film laminate enhances handling easiness of the glass film when the glass film is subjected to treatments associated with production, and can prevent occurrence of problems such as a positioning error and displacement in patterning. The surface of the glass film and the surface of the supporting glass, which are brought into contact with each other, have a surface roughness Ra of 2.0 nm or less respectively, and the glass film and the supporting glass are brought into contact with each other with such the smooth surfaces. As a result, the glass film and the supporting glass are in a close contact, thereby, it is possible to laminate the glass film and the supporting glass firmly and stably without use of adhesive. No adhesive is used, and hence, when the glass film is incorporated into any of various devices after the treatments associated with production, peeling off even one portion of the glass film from the supporting glass enables easy subsequent peeling off the whole glass film from the supporting glass. In addition, the glass film is free from any remaining adhesive.

On the other hand, if the surface roughness Ra exceeds 2.0 nm, the close contact decreases. As a result, it is not possible to laminate the glass film and the supporting glass firmly without use of adhesive.

According to the invention of the second aspect, since the surface of the glass film and the surface of the supporting glass, which are brought into contact with each other, have a GI value of 1000 pcs/m² or less respectively, the contacting surfaces of the glass film and supporting glass are clean, leading to undamaged activity of the surfaces. As a result, it is possible to laminate the glass film and the supporting glass more firmly and more stably without use of adhesive.

According to the invention of the third aspect, since the glass film has a thickness of 300 μm or less, even in an ultra-thin glass film, which is more difficult to handle and is easily involved in problems such as a positioning error and displacement in patterning, treatments associated with production can be easily carried out.

According to the invention of the fourth aspect, since the supporting glass has a thickness of 400 μm or more, the supporting glass can securely support the glass film.

According to the invention of the fifth aspect, since the difference of thermal expansion coefficients between the glass film and the supporting glass at 30 to 380° C. falls within $5 \times 10^{-7}$/° C., even when a heat treatment is carried out during treatments associated with production, a glass film laminate can hardly have a thermal warpage or the like.

According to the invention of the sixth aspect, since the glass film and the supporting glass are formed by the overflow down-draw method, the surfaces thereof have extremely high in surface precision without being subjected to a polishing process. As a result, the glass film and the supporting glass can be laminated more firmly.

According to the invention of the seventh aspect, since the glass film and the supporting glass are laminated so that at least a part of an edge portion includes a step, in the case where the glass film protrudes from the supporting glass, it is possible to peel off the glass film and the supporting glass from each other more easily in a more secure manner. On the other hand, in the case where the supporting glass protrudes from the glass film, it is possible to properly protect an end portion of the glass film from striking, or the like.

According to the invention of the eighth aspect, since the peeling sheet member is interposed at a partial region of the contact portion between the glass film and the supporting glass, and the sheet member partially protrudes from the contact portion, it is possible to peel off the glass film and the supporting glass from each other more easily in a more secure manner while grasping the protruding portion of the sheet member.

According to the invention of the ninth aspect, since the supporting glass includes at least one through-hole formed at a position being outside of an effective surface of the glass film, when the glass film is peeled off from the supporting glass, it is possible to raise up the glass film only by injecting compressed air or inserting a pin or the like through the through-hole, resulting in easily starting peeling off the glass film.

According to the invention of the tenth aspect, since the glass film laminate includes a guide member for positioning the glass film on the supporting glass at the glass film side, it is possible to easily position the glass film with respect to the supporting glass when the glass film is laminated on the supporting glass.

According to the invention of the eleventh aspect, since the guide member has a smaller thickness than the glass film, when the glass film laminate is subjected to a cleaning treatment as one of the treatments associated with production, it is possible to prevent a liquid from remaining on the surface of the glass film.

DETAILED DESCRIPTION OF THE INVENTION

Hereinafter, preferred embodiments of a glass film laminate according to the present invention are described with reference to the drawings.

Figure 1:
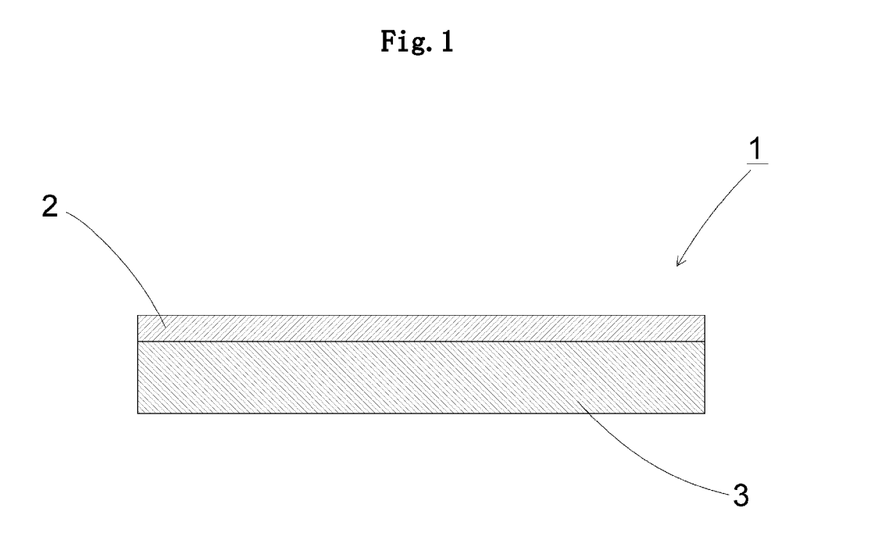
[FIG. 1] is a cross-sectional view of a glass film laminate according to the present invention.

A glass film laminate (1) according to the present invention comprises a glass film (2) and a supporting glass (3) as shown in FIG. 1. The glass film (2) and the supporting glass (3) are laminated without using adhesive, or the like.

For the glass film (2), silicate glass is used, silica glass or borosilicate glass is preferably used, or alkali-free glass is most preferably used. If the glass film (2) contains an alkali component, a cation is detached from a surface of the glass film, leading to occurrence of a so-called too-abundant soda phenomenon and resulting in a coarse structure. In this case, if the glass film (2) is continuously used in a bent state, the glass film (2) may break at a portion of being coarse because of aging degradation. Note that the alkali-free glass means glass substantially free of an alkali component (alkali metal oxide), and specifically, glass that contains the alkali component at a weight ratio of 1000 ppm or less. The content of the alkali component in the present invention is preferably 500 ppm or less, or more preferably 300 ppm or less.

The glass film (2) has a thickness of preferably 300 μm or less, more preferably 5 μm to 200 μm, or most preferably 5 μm to 100 μm. With this, a thickness of the glass film (2) may be made thinner to impart an appropriate flexibility to the glass film (2). Further, in this case, treatments associated with production can be easily carried out with respect to the glass film (2), which is hard to handle and easily causes problems such as a positioning error and displacement in patterning. If the thickness is less than 5 μm, the glass film (2) tends to have insufficient strength. As a result, when the glass film (2) is peeled off from the glass film laminate (1) to be incorporated into a device, the glass film (2) becomes liable to cause a breakage.

For the supporting glass (3), similar to the glass film (2), silicate glass, silica glass, borosilicate glass, alkali-free glass, or the like is used. The supporting glass (3) is preferably made of glass that has a difference of thermal expansion coefficients at 30 to 380° C. with respect to the glass film (2) falling within $5\times10^{-7}$/° C. With this, there can be provided the glass film laminate (1) in which thermal warpage or the like is not easily caused due to the difference in thermal expansion coefficients even when a heat treatment is carried out during treatments associated with production, and a stable laminated state can be maintained.

The supporting glass (3) preferably has a thickness of 400 μm or more. This is because if the supporting glass (3) has a thickness of less than 400 μm, the supporting glass (3) may have a problem in strength when handling the supporting glass (3) alone. The supporting glass (3) preferably has a thickness of from 400 μm to 700 μm, or most preferably from 500 μm to 700 μm. With this, the glass film (2) can be securely supported, and it becomes possible to effectively suppress a breakage that may occur when the glass film (2) is peeled off from the supporting glass (3).

Surface roughness Ra of each of the surfaces of the glass film (2) and the supporting glass (3) on the sides being brought into contact with each other is 2.0 nm or less. If the surface roughness Ra exceeds 2.0 nm, close contact therebetween is lowered. As a result, it is not possible to firmly laminate the glass film (2) and the supporting glass (3) without use of adhesive. The surfaces of the glass film (2) and supporting glass (3) have a surface roughness Ra of preferably 1.0 nm or less, more preferably 0.5 nm or less, or most preferably 0.2 nm or less, respectively.

GI value of each of the surface of the glass film (2) and the surface of the supporting glass (3) on the sides being brought into contact with each other is preferably 1000 pcs/m$^2$ or less. With this, the contacting surfaces of the glass film (2) and supporting glass (3) are clean without loss of the activities of the surfaces. As a result, it is possible to laminate the glass film (2) and the supporting glass (3) more firmly and more stably without use of adhesive. The GI value used in the present specification refers to a number (pcs) of impurity particles having a major diameter of 1 μm or more and existing in a region of 1 m$^2$. The surfaces of the glass film (2) and supporting glass (3) have a GI value of preferably 500 pcs/m$^2$ or less, or most preferably 100 pcs/m$^2$ or less, respectively.

Figure 2:
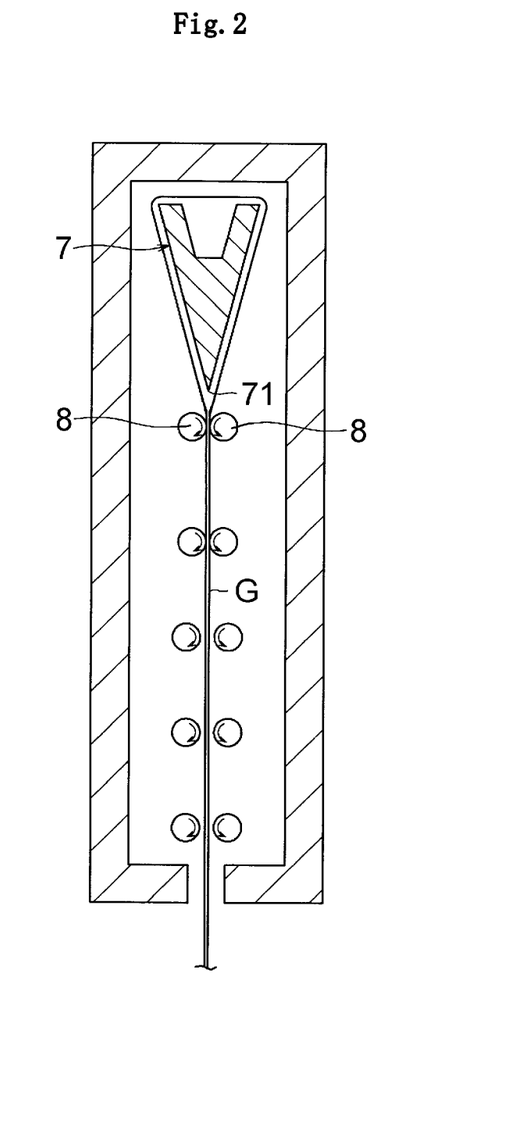
[FIG. 2] is an explanatory diagram of a manufacturing apparatus for a glass film and a supporting glass.

The glass film (2) and the supporting glass (3) to be used in the present invention are preferably formed by a down-draw method. This is because the glass film (2) and the supporting glass (3) can be formed so as to have a smoother surface. In particular, the overflow down-draw method shown in FIG. 2 is a forming method in which both surfaces of a glass sheet are not brought into contact with a forming body during a forming process, and hence flaws are hardly caused on the both surfaces (transparent surfaces) of the obtained glass sheet, and high surface-quality may be obtained for the glass sheet without polishing. With this, it is possible to laminate the glass film (2) and the supporting glass (3) more firmly.

A glass ribbon (G) immediately after being flown down from a lower end portion (71) of a forming body (7) having a wedge shape in cross-section is drawn downwardly while being restricted shrinkage thereof in a width direction by cooling rollers (8), to be thin in a predetermined thickness. Subsequently, the glass ribbon (G) having the predetermined thickness is annealed in an annealer to remove heat strain in the glass ribbon (G), followed by cutting of the glass ribbon (G) into a predetermined size. As a result, a glass sheet serving as the glass film (2) or the supporting glass (3) is formed.

Figure 3A:
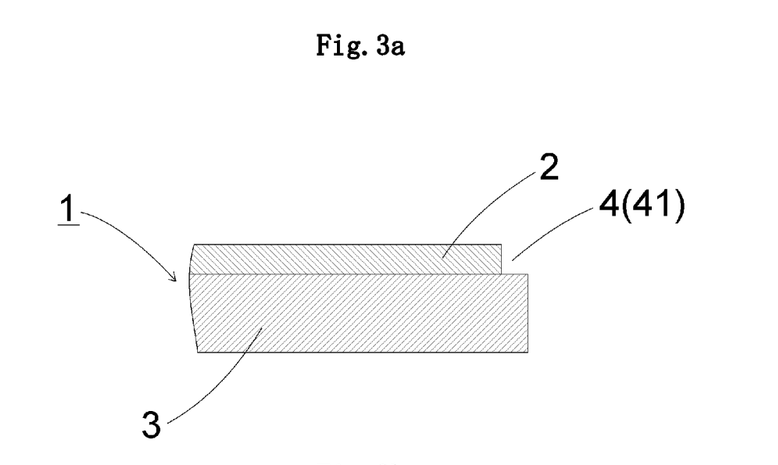
[FIG. 3(a)] is a view of a glass film laminate in which a glass film and a supporting glass are laminated with a step at an edge portion of the glass film laminate, for showing a state in which the supporting glass protrudes from the glass film.
Figure 3B:
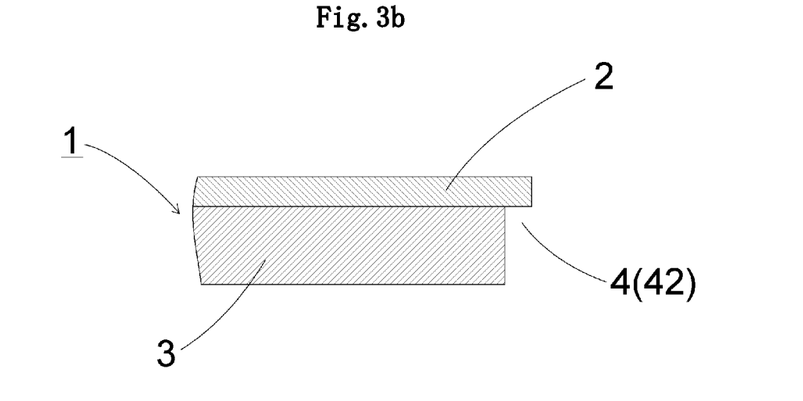
[FIG. 3(b)] is a view showing a state in which the glass film protrudes from the supporting glass.
Figure 3C:
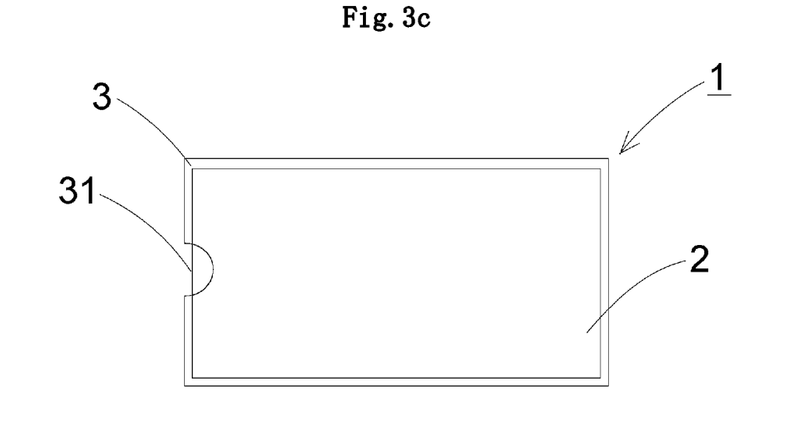
[FIG. 3(c)] is a view showing a state in which a notch is formed in the supporting glass.

FIGS. 3(a) to 3(c) are views of a glass film laminate in which a glass film and a supporting glass are laminated with a step at an edge portion of the glass film laminate, in which: 3(a) is a view showing a state in which the supporting glass protrudes from the glass film; 3(b) is a view showing a state in which the glass film protrudes from the supporting glass; and 3(c) is a view showing a state in which a notch is formed in the supporting glass.

The glass film laminate (1) according to the present invention preferably has a structure in which, as shown in FIGS. 3(a) to 3(c), the glass film (2) and the supporting glass (3) are laminated with a step (4). In FIG. 3(a), a step (41) is formed so that the supporting glass (3) protrudes from the glass film (2). With this, the end portion of the glass film (2) can be protected more appropriately. On the other hand, in FIG. 3(b), a step (42) is formed so that the glass film (2) is protruded from the supporting glass (3). With this, when the peeling off of the glass film (2) and the supporting glass (3) is started, only the glass film (2) can easily be grasped, and hence the peeling off of the both can be performed more easily in a more secure manner.

The step (4) may only be formed at least a part of the peripheral portion of the glass film laminate (1). For example, when the glass film laminate (1) has a rectangular shape in a planar view, a step may only be formed at least one side out of the four sides. Further, a notch (orientation flat) may be formed at a part of one of the four corners of the supporting glass (3) or the glass film (2), to thereby form a step.

In the configuration shown in FIG. 3(b), the protrusion amount of the glass film (2) is preferably 0.5 mm to 20 mm. If the protrusion amount is less than 0.5 mm, there is a possibility of becoming hard to grasp the edge portion of the glass film (2) at the time of the start of peeling off. And if the protrusion amount exceeds 20 mm, there is a possibility of causing a breakage of the glass film (2) when an external force such as striking is applied to the side edge portion of the glass film laminate (1).

In addition, the glass film laminate (1) may have different steps one of which is formed by protruding the edge portion of the supporting glass (3) from the edge portion of the glass film (2) and the other of which is formed by protruding the edge portion of the glass film (2) from the edge portion of the supporting glass (3), at the end portion of the glass film laminate (1). In this case, each of the glass film (2) and the supporting glass (3) can be grasped at the same time, and hence the glass film (2) can be peeled off more easily. The respective steps are most preferably formed adjacently to each other.

In addition, as shown in FIG. 3(c), in a case where the size of the glass film (2) is smaller than the size of the supporting glass (3), a notch portion (31) is preferably formed at an end portion of the supporting glass (3). As a result, besides an appropriate protection of the edge portion of the glass film (2), when peeling off the glass film (2), the glass film (2) can be easily grasped at the portion exposed from the notch portion (31) of the supporting glass (3), thereby being capable of easily peeling off the glass film (2). The notch portion (31) can be formed by partially grinding an end portion of the supporting glass (3) with a grinding stone, or the like, or by partially cutting out an end portion with a core drill, or the like.

It is preferred that a peeling sheet member be interposed at a partial region of the contact portion between the glass film (2) and the supporting glass (3), while being protruded from the glass film laminate (1). This is because the peeling off of the glass film (2) can easily be carried out by grasping only the protruded portion of the sheet member from the glass film laminate (1). Any known resin sheet can be used as the sheet member. The thickness of the sheet member is preferably thinner to such an extent that the sheet member does not break when only the sheet member is pulled at the time of peeling off the glass film (2). As long as the sheet member may serve for peeling off the glass film (2), the sheet member is not particularly limited in terms of an interposing amount and the protrusion amount. For example, the sheet member is preferably about 1 to 2 cm in length and width.

When the glass film (2) and the supporting glass (3) are peeled off, it is preferred that the glass film laminate (1) be immersed in water, and the peeling off be performed while applying ultrasonic waves. With this, the amount of a force required for peeling off the glass film (2) and the supporting glass (3) may be reduced, so that the glass film (2) and the supporting glass (3) are easily peeled off from each other.

Figure 4A:
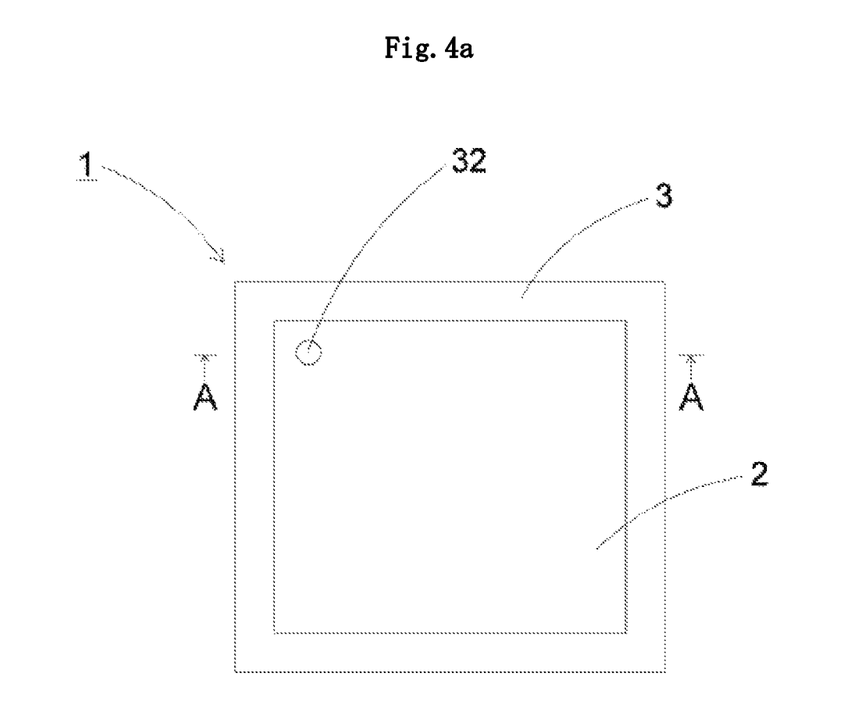
[FIG. 4(a)] is a plan view showing a state in which a through-hole is formed in a supporting glass.
Figure 4B:
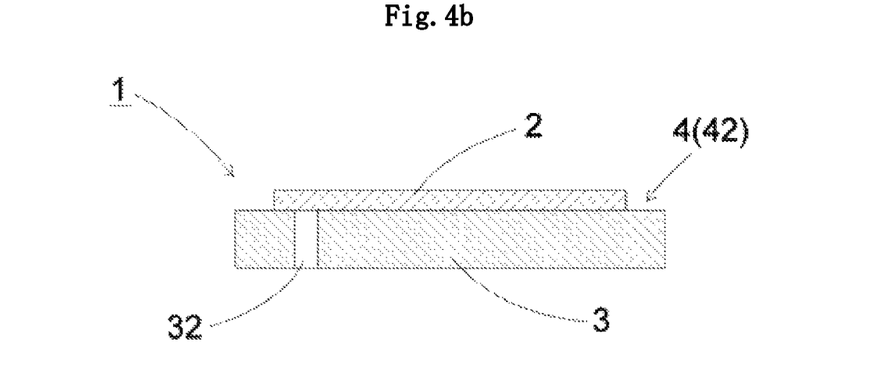
[FIG. 4(b)] is a cross-sectional view taken along the line A-A of FIG. 4(a).

FIGS. 4(a) and 4(b) are views showing a state in which a through-hole is formed in a supporting glass: in which, 4(a) is a plan view; and 4(b) is a cross-sectional view taken along the line A-A.

The supporting glass (3) is preferably provided with at least one through-hole (32). The through-hole (32) is formed at a position at least a part thereof is covered by the glass film (2). When the glass film (2) is peeled off from the supporting glass (3), only the glass film (2) in the glass film laminate (1) can be raised up from the supporting glass (3) by injecting compressed air or inserting a pin or the like through the through-hole (32), resulting in easily starting peeling off the glass film (2).

Onto the glass film (2) in the vicinity of the through-hole (32), there is a possibility of an external force being applied due to a bending stress at the starting of peeling off or the striking of the pin or the like. In addition, a strain is likely generated in the glass film (2) in the vicinity of the through-hole (32) after being subjected to a heating process, owing to a difference in heat transfer due to presence or absence of the support glass (3) in the vicinity of the through-hole (32). Therefore, it is preferred to form the through-hole (32) at a position corresponding outside of the effective surface of the glass film (2). Note that, outside of the effective surface of the glass film (2) means, for example, an unnecessary portion that is cut and removed when the glass film (2) is incorporated into a device, or, when forming a film on the surface the glass film (2), a non-effective portion that is out of a range of forming the film.

The shape of the through-hole (32) is not particularly limited, for example, to a circular shape, a polygonal shape such as a triangle or quadrangle. However, the circular shape is preferred from the viewpoints of workability or prevention of crack of the through-hole (32). Also the size of the through-hole (32) is not particularly limited. There is exemplified a through-hole (32) having an opening having a diameter of 1 mm to 50 mm. The through-hole (32) is preferably formed in the vicinity of any of the four corners when the glass film laminate (1) has a rectangular shape in a planar view.

Figure 5A:
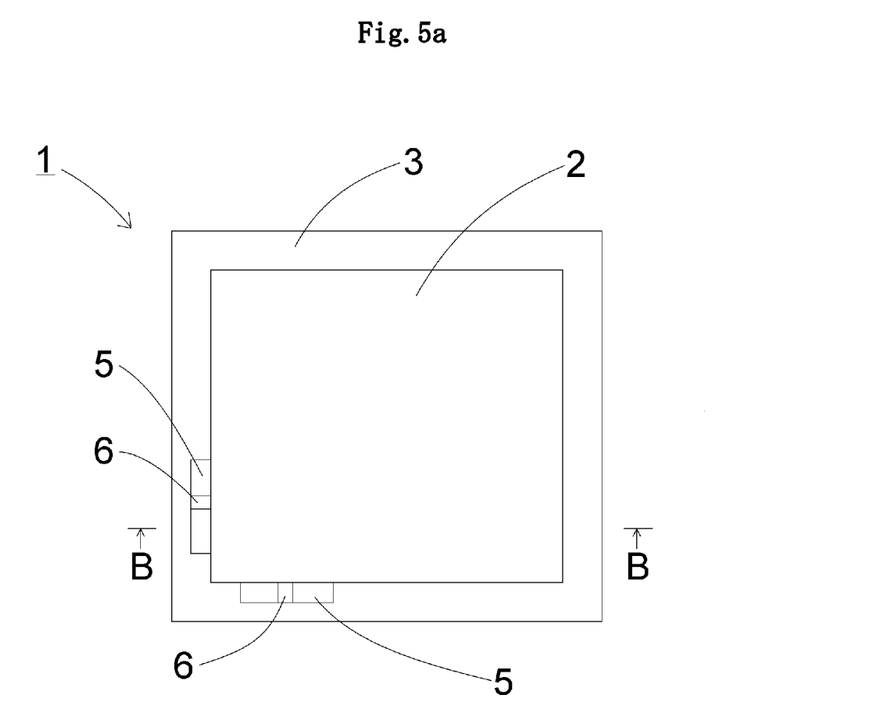
[FIG. 5(a)] is a plan view showing a state in which guide members are provided on a supporting glass.
Figure 5B:
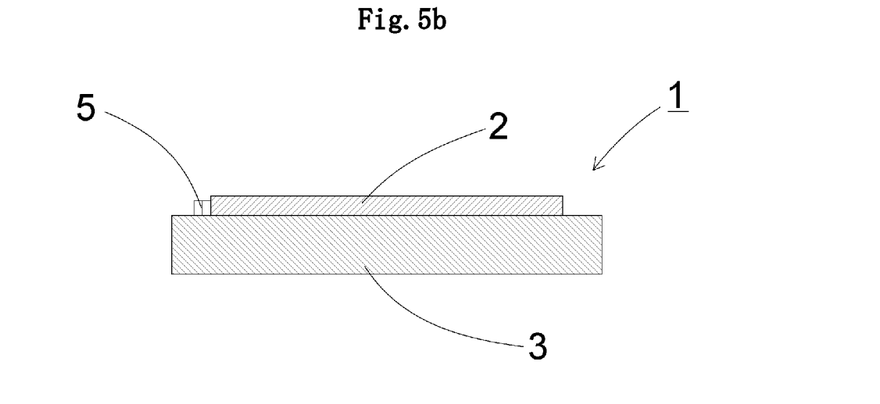
[FIG. 5(b)] is a cross-sectional view taken along the line B-B of FIG. 5(a).

FIGS. 5(a) and 5(b) are views showing a state in which guide members are provided on a supporting glass: in which 5(a) is a plan view; and 5(b) is a cross-sectional view taken along the line B-B.

A guide member (5) is preferably provided at outer peripheral portion of the supporting glass (3) on the glass film (2) side. With this, the positioning of the glass film (2) can be easily performed when laminating the glass film (2) on the supporting glass (3).

As shown in FIGS. 5(a) and 5(b), when the glass film laminate (1) has a rectangular shape in a planar view, guide members (5) are provided in parallel to two adjacent sides of the supporting glass (3). With this, the positions of the two sides of the glass film (2) on the supporting glass (3) are determined, thereby being capable of more reliably performing the positioning of the glass film (2). Further, the guide members (5) are made lower than a thickness of the glass film (2) as shown in FIG. 5(b), and hence, after the glass film laminate (1) being subjected to a cleaning process, a liquid is prevented from remaining on the glass film (2) and effectively discharged. In addition, groove (6) is formed on the guide member (5), thereby the discharge performance of the liquid can be further improved. It is preferred that a plurality of the grooves (6) are formed on each of the guide members (5).

The guide member (5) is preferably made of glass. This is because in the case where the glass film laminate (1) is subjected to a heating process, deterioration or wear of the guide member (5) can be prevented. The guide members (5) may be fixed by fusion bonding with glass frits, adhesion with resins, or the like.

In a case where a gap is formed between the guide member (5) and the glass film (2), the gap can be infilled with filling a resin. An ultraviolet curable resin is preferably used as the resin to be filled. When the glass film (2) is peeled off from the supporting glass (3), the resin can be cured by being irradiated with ultraviolet rays. As a result, the adhesive force can be lowered, thereby being capable of easily peeling off.

EXAMPLES

Hereinafter, the glass film laminate of the present invention is described in detail based on examples, but the present invention is not limited to these examples.

A transparent glass sheet having a rectangular shape and having 250 mm in length, 250 mm in width, and 700 μm in thickness was used as a supporting glass. A glass film having 230 mm in length, 230 mm in width, and 100 μm in thickness was used as a glass film to be laminated on the supporting glass. Used for the supporting glass and the glass film was alkali-free glass manufactured by Nippon Electric Glass Co., Ltd. (Production name: OA-10G, thermal expansion coefficient at 30 to 380° C.: $38 \times 10^{-7}$/° C.). The glass formed by the overflow down-draw method was used without polishing as it is, or by appropriately controlling amounts of polishing and chemical etching, to thereby control the surface roughness Ra. The surface roughness Ra of the contacting surface of each of the supporting glass and the glass film was measured by using an AFM (Nanoscope III a) manufactured by Veeco Instruments under the conditions of a scan size of 10 μm, a scan rate of 1 Hz, and 512 sample lines. The surface roughness Ra was determined from measured values within a 10 μm square measurement range. After the measurement, each of the supporting glasses and the glass films was divided into test groups shown in Table 1.

With respect to the supporting glasses and the glass films thus grouped, by controlling cleaning and indoor air conditioning, amounts of dust contained in the water and the air were adjusted, and thus amounts of dust attaching to the contacting surfaces of the supporting glasses and glass films were adjusted, to thereby control the GI value. The GI value was measured by using GI7000 manufactured by Hitachi High-Tech Electronics Engineering Co., Ltd.

After that, in accordance with the respective divisions shown in Table 1, the glass films were laminated on the supporting glasses, and thus the glass film laminates of Examples 1 to 8 and Comparative Examples 1 to 3 were obtained.

Each of the obtained glass film laminates was subjected to a cleaning process to determine the quality of adhesive strength. As for glass film laminates, in which the peeling off occurred due to incursion of the water between the contacting surfaces during the cleaning step, "x" are marked. As for a glass film laminate which was cleaned without causing the peeling off, "o" are marked. As for a glass film laminate, in which the peeling off was not occurred even being subjected to further friction cleaning with a brush, "⊚" are marked. The close contactness of the glass film laminates was thus determined. Table 1 shows the results.

TABLE 1

|  | Example 1 | Example 2 | Example 3 | Example 4 |
|---|---|---|---|---|
| Glass film Ra (nm) | 0.2 | 0.5 | 1.0 | 2.0 |
| Supporting glass Ra (nm) | 0.2 | 0.5 | 1.0 | 2.0 |
| Glass film GI value (pcs/m²) | 500 | 500 | 500 | 500 |
| Supporting glass GI value (pcs/m²) | 500 | 500 | 500 | 500 |
| Result of determination | ⊚ | o | o | o |

|  | Example 5 | Example 6 | Example 7 | Example 8 |
|---|---|---|---|---|
| Glass film Ra (nm) | 0.2 | 0.2 | 0.2 | 0.2 |
| Supporting glass Ra (nm) | 0.5 | 0.5 | 0.5 | 0.5 |
| Glass film GI value (pcs/m²) | 100 | 500 | 800 | 1000 |
| Supporting glass GI value (pcs/m²) | 100 | 500 | 800 | 1000 |
| Result of determination | ⊚ | o | o | o |

|  | Comparative Example 1 | Comparative Example 2 | Comparative Example 3 |
|---|---|---|---|
| Glass film Ra (nm) | 1.0 | 2.5 | 2.5 |
| Supporting glass Ra (nm) | 2.5 | 1.0 | 2.5 |
| Glass film GI value (pcs/m²) | 500 | 500 | 500 |
| Supporting glass GI value (pcs/m²) | 500 | 500 | 500 |
| Result of determination | x | x | x |

As shown in Table 1, in Examples 1 to 8 in which the glass film and supporting glass have a surface roughness Ra of 2.0 nm or less respectively, the glass film and the supporting glass have a sufficient close contact, and hence each glass film laminate can be cleaned without causing the peeling off. Contrary, in Comparative Examples 1 to 3, in which any one of the glass film and the supporting glass has a surface roughness Ra of 2.5 nm or more, as the contacting surfaces is rough, and hence the close contact between the glass film and the supporting glass is low, which shows that the water to causes the peeling off entered between the contacting surfaces of the both glasses during cleaning.

Industrial Applicability

The present invention can be suitably used as a glass substrate for devices such as a flat panel display including a liquid crystal display and an OLED display and a solar cell and as a cover glass for an OLED lighting device.

Description of Symbols

| 1 | glass film laminate |

-continued

| | Description of Symbols |
|---|---|
| 2 | glass film |
| 3 | supporting glass |
| 32 | through-hole |
| 4 | step |
| 5 | guide member |
| 6 | groove |

The invention claimed is:

1. A glass film laminate comprising:
a glass film made of silicate glass and formed by an overflow down-draw method; and
a supporting glass made of silicate glass and formed by an overflow down-draw method, wherein
a surface of the glass film and a surface of the supporting glass, which are in contact with each other, are fire-polished surfaces and have a surface roughness Ra of 2.0 nm or less, respectively, and
the glass film and the supporting glass are peelably laminated on each other without an adhesive by a direct contact between the surface of the glass film and the surface of the supporting glass.

2. The glass film laminate according to claim 1, wherein the surface of the glass film and the surface of the supporting glass have a GI value of 1000 pcs/m$^2$ or less respectively.

3. The glass film laminate according to claim 1, wherein the glass film has a thickness of 300 μm or less.

4. The glass film laminate according to claim 1, wherein the supporting glass has a thickness of 400 μm or more.

5. The glass film laminate according to claim 1, wherein a difference of thermal expansion coefficients between the glass film and the supporting glass at 30 to 380° C. is $5\times10^{-7}$/° C. or less.

6. The glass film laminate according to claim 1, wherein the glass film and the supporting glass are laminated so that at least a part of an edge portion of the glass film laminate includes a step.

7. The glass film laminate according to claim 1, further comprising a peeling sheet member interposed at a partial region of a contact portion between the glass film and the supporting glass, the peeling sheet member partially protruding from the contact portion.

8. The glass film laminate according to claim 1, wherein the supporting glass includes at least one through-hole formed at a position in the vicinity of one of four corners of the glass film.

9. The glass film laminate according to claim 1, further comprising a guide member for positioning the glass film on the supporting glass at a glass film side.

10. The glass film laminate according to claim 9, wherein the guide member has a smaller thickness than the glass film.

11. The glass film laminate according to claim 2, wherein the glass film has a thickness of 300 μm or less.

12. The glass film laminate according to claim 2, wherein the supporting glass has a thickness of 400 μm or more.

13. The glass film laminate according to claim 2, wherein a difference of thermal expansion coefficients between the glass film and the supporting glass at 30 to 380° C. is $5\times10^{-7}$/° C. or less.

14. The glass film laminate according to claim 2, wherein the glass film and the supporting glass are laminated so that at least a part of an edge portion of the glass film laminate includes a step.

15. The glass film laminate according to claim 2, further comprising a peeling sheet member interposed at a partial region of a contact portion between the glass film and the supporting glass, the peeling sheet member partially protruding from the contact portion.

16. The glass film laminate according to claim 2, wherein the supporting glass includes at least one through-hole formed at a position in the vicinity of one of four corners of the glass film.

17. The glass film laminate according to claim 2, further comprising a guide member for positioning the glass film on the supporting glass at a glass film side.

* * * * *